United States Patent
Sivakumar et al.

(10) Patent No.: US 11,505,451 B2
(45) Date of Patent: Nov. 22, 2022

(54) APPARATUS HAVING A BONDLINE STRUCTURE AND A DIFFUSION BARRIER WITH A DEFORMABLE APERTURE

(71) Applicant: TEXAS INSTRUMENTS INCORPORATED, Dallas, TX (US)

(72) Inventors: Ganapathy Subramaniam Sivakumar, Allen, TX (US); Chad Alan McKay, St. Paul, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/820,477

(22) Filed: Mar. 16, 2020

(65) Prior Publication Data

US 2020/0216306 A1    Jul. 9, 2020

Related U.S. Application Data

(62) Division of application No. 15/859,184, filed on Dec. 29, 2017, now abandoned.

(51) Int. Cl.
*B81B 7/00* (2006.01)
*B81C 1/00* (2006.01)

(52) U.S. Cl.
CPC ........ *B81B 7/0058* (2013.01); *B81C 1/00269* (2013.01); *B81C 1/00285* (2013.01); *B81B 2201/042* (2013.01); *B81B 2203/0315* (2013.01); *B81B 2207/012* (2013.01); *B81B 2207/017* (2013.01); *B81C 2203/0109* (2013.01); *B81C 2203/019* (2013.01); *B81C 2203/0118* (2013.01); *B81C 2203/035* (2013.01); *B81C 2203/036* (2013.01); *B81C 2203/0707* (2013.01)

(58) Field of Classification Search
CPC ... B81B 7/0038; B81B 7/0041; B81B 7/0058; B81B 7/0035–0041; B81C 1/00269; B81C 1/00285; B81C 1/00293; B81C 2203/019; B81C 2203/0109; B81C 2203/0118; B81C 2203/035; B81C 2203/036; B81C 2203/037; B81C 1/00277–00293; H01L 23/10
See application file for complete search history.

(56) References Cited

U.S. PATENT DOCUMENTS 6,170,736 B1    1/2001  Briehl et al.
6,252,229 B1    6/2001  Hays et al.
(Continued)

FOREIGN PATENT DOCUMENTS

WO    WO-2013088945 A1 *    6/2013    ......... B81C 1/00269

OTHER PUBLICATIONS

International Search Report for PCT/US2018/068114 dated Apr. 18, 2019.

*Primary Examiner* — Younes Boulghassoul
(74) *Attorney, Agent, or Firm* — Michelle F. Murray; Charles A. Brill; Frank D. Cimino

(57) ABSTRACT

In described examples, a bondline structure is arranged along a periphery of a cavity. The bondline structure extends from a first substrate and is configured to bond with an interposer arranged on a second substrate. A diffusion barrier is arranged on the first substrate for contacting the interposer. The diffusion barrier is arranged to impede a contaminant against migrating from the bondline structure and entering the cavity.

20 Claims, 12 Drawing Sheets

(56) References Cited

U.S. PATENT DOCUMENTS

| | | | |
|---|---|---|---|
| 8,975,105 B2 | 3/2015 | Moody | |
| 2001/0022207 A1* | 9/2001 | Hays | G01J 5/04 |
| | | | 148/518 |
| 2008/0067652 A1 | 3/2008 | Menard et al. | |
| 2009/0029500 A1* | 1/2009 | Wan | B81C 1/00269 |
| | | | 438/51 |
| 2011/0133294 A1 | 6/2011 | Park et al. | |
| 2012/0120616 A1 | 5/2012 | Katsui et al. | |
| 2012/0202300 A1 | 8/2012 | Yu et al. | |
| 2012/0319303 A1* | 12/2012 | Foster | H01L 23/10 |
| | | | 257/787 |
| 2013/0011941 A1 | 1/2013 | Chan et al. | |
| 2013/0285228 A1* | 10/2013 | Montez | H01L 23/10 |
| | | | 257/684 |
| 2014/0186999 A1 | 7/2014 | Schweikert et al. | |
| 2015/0014854 A1 | 1/2015 | Gooch et al. | |
| 2017/0133708 A1 | 5/2017 | Oukassi et al. | |
| 2018/0162720 A1* | 6/2018 | Cheng | B81B 7/02 |

\* cited by examiner

APPARATUS HAVING A BONDLINE STRUCTURE AND A DIFFUSION BARRIER WITH A DEFORMABLE APERTURE

CROSS-REFERENCE TO RELATED APPLICATION

This application is a divisional of, and claims priority to U.S. application Ser. No. 15/859,184, filed Dec. 29, 2017, the subject matter of which is herein incorporated by reference.

BACKGROUND

Microelectromechanical system (MEMS) devices such as actuators, switches, motors, sensors, variable capacitors, spatial light modulators (SLMs) and similar microelectronic devices can be manufactured on a substrate. To protect such devices, sidewalls are formed on the substrate during manufacturing to form a sealable cavity, such that structures and devices within the cavity can be relatively isolated from an outside environment. However, contaminants can gradually migrate into the cavity, and can react with or otherwise interfere with proper operation of devices included within the cavity.

SUMMARY

In described examples, a bondline structure is arranged along a periphery of a cavity. The bondline structure extends from a first substrate and is configured to bond with an interposer arranged on a second substrate. A diffusion barrier is arranged on the first substrate for contacting the interposer. The diffusion barrier is arranged to impede a contaminant against migrating from the bondline structure and entering the cavity.

DETAILED DESCRIPTION

Figure 1:
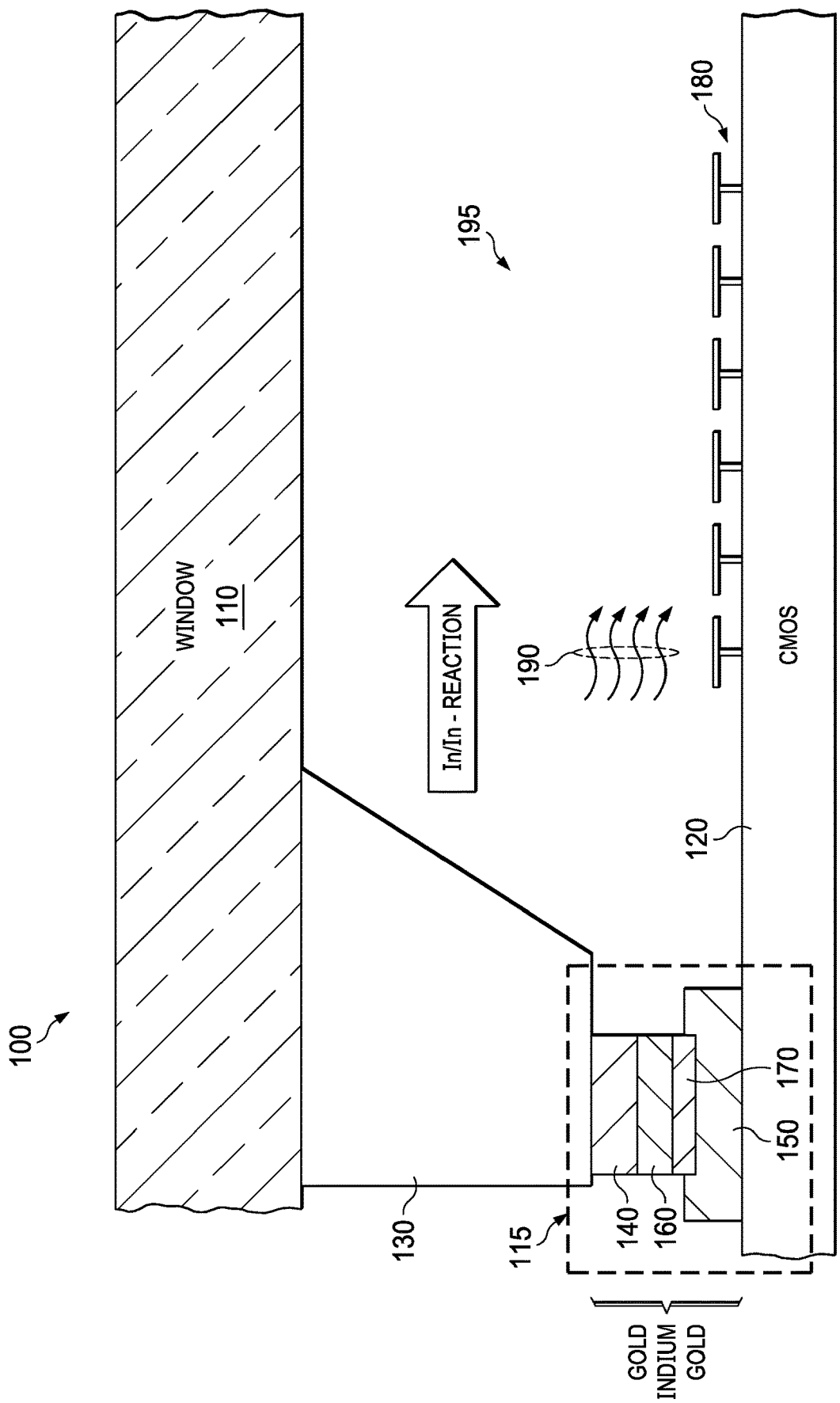
FIG. 1 is a cross-sectional diagram of an example two-substrate assembly of a device, such as a DMD device.

In this description: (A) the term "portion" can mean an entire portion or a portion that is less than the entire portion; (B) the term "formed on a substrate" can mean being arranged such that the "formed" object is supported by the substrate and extends above a preexisting surface of the substrate; (C) the terms "inwards" and "inner" can refer to a direction towards a cavity formed on a substrate; (D) the terms "outwards" and "outer" can refer to a direction away from a cavity formed on a substrate, such as a direction towards a wafer edge, a die edge, or a saw lane; (E) the terms "downwards" and "lower" can refer to a direction towards a first substrate, such as a silicon substrate; and (F) the terms "upwards" and "upper" can refer to a second substrate, such as a glass wafer.

Microelectromechanical system (MEMS) devices such as actuators, switches, motors, sensors, variable capacitors, spatial light modulators (SLMs) and similar microelectronic devices can have movable elements. For example, an SLM device can include an array of movable elements. Each such element can be an individually addressable light modulator element in which an "on" or "off" position is set in response to input data. The input data can be image information to command light modulator elements of the array to either project or block light directed at the array from an illumination source.

In an example SLM device of an image projection system, the input data includes bit frames generated in response to pixel hue and intensity information data of an image frame of an image input signal. The bit frames can be projected using a pulse-width modulation. Pulse-width modulation schemes include weighted time intervals for projection of pixels of pixel hue and intensity corresponding to respective pixels in the input data. The weighted time intervals are sufficiently long to permit human eye integration over a given image frame display period. An example of an SLM device is a digital micromirror device (DMD), such as a Texas Instruments DLP® micromirror array device. Such DMD devices have been commercially employed in a wide variety of devices, such as televisions, cinemagraphic projection systems, business-related projectors and picoprojectors.

DMD devices can be manufactured to include micromirrors to digitally image and project an input digital image onto a display surface (such as a projection screen). For example, a projector system can include a DMD device arranged to modulate an incident beam of light received through a window glass of the DMD device and focused on micromirrors therein. Each such micromirror can be individually and dynamically adjusted in response to input data to project a visual image onto a projection screen.

An individual micromirror can be formed as a portion of a torsion spring. When the mirror goes "hard over," the mirror contacts (e.g., hits) a stopping surface. Occasionally, the contacting mirror encounters environmentally induced adhesion (e.g., stiction) forces sufficient to prevent the mirror from rebounding from the stopping surface. Such stiction can result from environmental contamination and can create defects and reliability problems.

Another such problem is excessive dynamic friction, which can result from contact between moving elements in a MEMS device. Both the excessive dynamic friction and the incidence of adhesion can be reduced by coating surfaces of the moving elements of a MEMS device with a passivating agent or lubricant (e.g., "lube").

However, the passivating agents and lubricating coatings can be compromised by other chemical species used to manufacture a MEMS device. Over time, chemical species can migrate and then degrade the performance of moving elements of a MEMS device. Such coatings for MEMS devices are described in U.S. patent application Ser. No. 14/333,829, filed Jul. 17, 2014, entitled "Coatings for Relatively Movable Surfaces," by W. Morrison, et al., which is incorporated herein by reference in its entirety for all purposes.

In the manufacture of semiconductors and MEMS devices, each MEMS device is manufactured using wafer-scale processing techniques. For example, a wafer can include many like MEMS devices arranged in rows and columns (e.g., in an array) on a substrate of a single wafer. Such techniques can decrease costs because many devices can be processed in parallel by simultaneously applying process steps. Various MEMs devices can be formed on a surface of a first substrate (such as a silicon substrate). Bondline structures can be formed (e.g., positioned) on the first substrate or a second substrate. The bondline structures can: define a distance that separates the first and second substrates; structurally bond the first substrate to the second substrate to form a unified substrate assembly; and hermetically seal a cavity enclosed by the first and second substrates and the bondline structures. In described examples, a MEMS device is sealed in such a cavity, such that the MEMS device is protected from an outside environment. (However, electrical signals can be coupled to and from the MEMS device via electrical conductors traversing a hermetically sealed sidewall, for example.)

As described hereinbelow, a diffusion barrier is formed on a substrate and is formed adjacent to a bondline of a sidewall to impede (and/or otherwise restrict) reactant species surrounding the diffusion barrier against migrating into a cavity. For example, a diffusion barrier can be positioned adjacent (e.g., inwards) from the bondline structure to impede (e.g., prevent) the migration of reactant species from substances in bondline structures against entering a headspace of the cavity. The bonding substances can: include indium (In) and/or other reactant species; outgas from (or otherwise traverse through) the sidewall; diffuse through the headspace; and contaminate sensitive structures such as micromirrors (as well as the coating of lubricant and/or passivating agents thereof). The diffusion barrier can include surfaces of an interposer, extensions, and (e.g., portions of) the substrate itself, wherein the surfaces can be exposed to potential contaminants outgassing from bonding substances, and the surfaces are arranged in between the bondline structure and the cavity.

As described hereinbelow with respect to FIG. 4B (for example), reliability and performance of a DMD device can be improved by at least one diffusion barrier positioned adjacent to the bondline structure and arranged to impede migration of a contaminant from (or through) the bondline structure. Surfaces of diffusion barrier(s) can impede (e.g., physically block) migration of contaminants, which can otherwise diffuse and react with surfaces, coatings, or headspace gasses.

FIG. 1 is a cross-sectional diagram of an example two-substrate assembly of a device, such as a DMD device. The DMD device 100 includes a first substrate 120: the first substrate 120 can be a semiconductor wafer (or die) formed from a crystalline lattice of silicon or gallium arsenide, for example. The DMD device 100 can also include a second substrate 110, such as a glass wafer (or glass die). Either or both of the first substrate 120 or the second substrate 110 can include structures (e.g., formed or arranged thereon) positioned to form sidewalls extending between the first substrate 120 and the second substrate 110. The sidewalls usually run along (e.g., inside) of saw lanes along which dies can be singulated from a wafer. The sidewalls usually run along all four outer sides of a singulated die.

The first substrate 120 and the second substrate 110 delimit first and second opposing boundaries (e.g., upper and lower bounds) of a headspace 195. A diffusion barrier (e.g., diffusion barrier 460, discussed hereinbelow with respect to FIG. 4B) can be arranged adjacent to (e.g., inside) a bondline structure 115 and arranged between interposer 130 (which is coupled to the second substrate 110) and the first substrate 120. The diffusion barrier as described hereinbelow can be arranged to encircle the headspace 195 to impede the migration of contaminants from the bondline structure 115 into the headspace 195.

The first substrate 120 and the second substrate 110 can be formed in accordance with wafer-level processing to achieve an economy of scale. The first substrate 120 can be formed with terminals (e.g., pins, not shown) on a lower surface of the first substrate 120 to electrically intercouple with other system devices. In other examples, die-level bonding processes and structures can replace the wafer-level bonding processes and structures described herein.

The sidewalls are positioned to protect sensitive components 180 of a chip (e.g., singulated die) within a cavity peripherally supported by the sidewalls. The sensitive components 180 can include an array of micromirrors. Each micromirror includes a mirror portion, which is coupled to the first substrate 120 and is selectively rotatable.

The sidewalls of the DMD device 100 includes an interposer 130 arranged to bond the first substrate 120 to the second substrate 110. A surface (e.g., inside surface) of the interposer 130 defines a portion of an extent (e.g., boundary) of the headspace 195 (of the cavity). The interposer 130 can include silicon, but other materials can be used.

The interposer 130 runs along a length (e.g. long axis) of the bondline structure 115 and can be bonded along the bondline structure 115 to form a hermetically sealed assembly (which can include the headspace 195). As described hereinbelow, the bondline structure 115 includes bonding substances that can outgas reactant species, which are chemically capable of reacting with portions of the sensitive components 180.

In an example, the bondline structure 115 is arranged as a stack including: a first gold (Au) layer 140; an indium (In) layer 160; and a second gold layer 150. The first substrate 120 is bonded to the second substrate 110 by applying compressive forces (e.g., applied normal to the first and second substrates 120 and 110) and heat to activate a bonding mechanism (e.g., intermetallic layer 170) between the two substrates 120 and 110. Accordingly, the bondline structure 115 can hermetically seal the substrate/wafer assembly (HWA) as a unified wafer assembly.

The indium species 190 of the bondline structure 115 can react with other components (e.g., gasses or devices) in the headspace 195. For example, the indium species 190 (or other reactive species or reaction products) can form an accretive film, which can cover portions of the micromirrors, and can increase the incidence of stiction. The indium species 190 can migrate in gaseous form along a diffusion gradient in the headspace 195 from the indium layer 160 in the bondline structure 115 to the sensitive components 180 (e.g., micromirrors).

As described hereinbelow, micromirrors sheltered (e.g., located further away) from the (e.g., gold-indium-gold) bondline structure 115, encounter fewer defects due to lesser accretion of reactant species and products. For example, indium-carboxylate (In—COOH) can be a reaction species, accreted particularly on structures adjacent to the periphery of the device (e.g., structures closer to the bondline structure 115).

Figure 2:
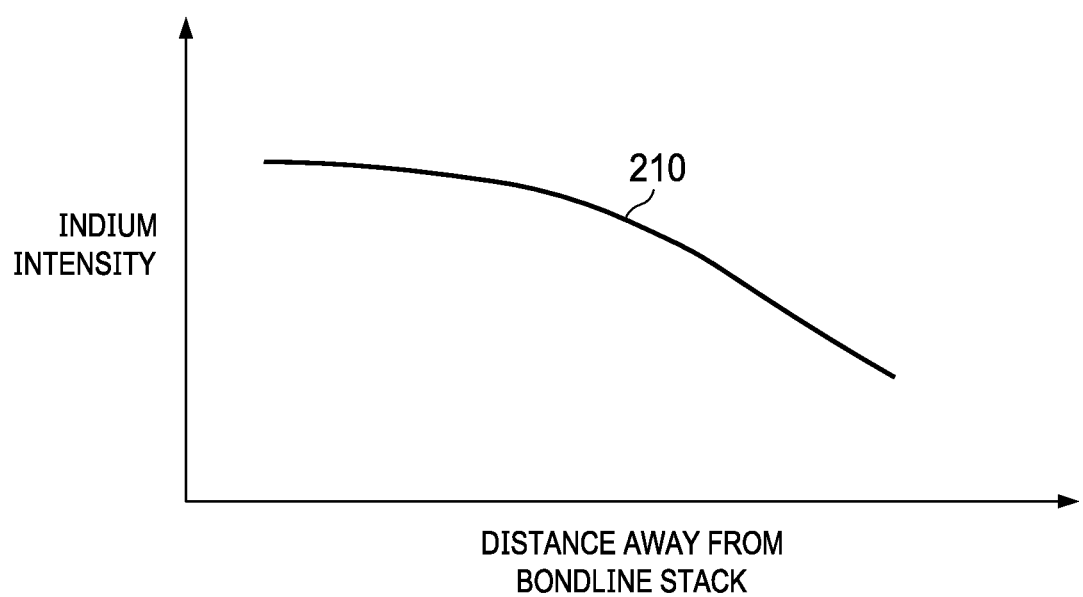
FIG. 2 is a plot diagram showing an example relationship of an intensity of indium reactant species as a function of distance from a bondline structure.

FIG. 2 is a plot diagram showing an example relationship of an intensity of indium reactant species as a function of distance from the bondline structure 115. For example, the curve 210 generally shows decreasing intensity of the accretion of indium reactant species (e.g., 190) as the distance from the bondline structure (e.g., 115) increases. (The curve 210 is empirically determined from detailed examination of defective devices.)

Figure 3:
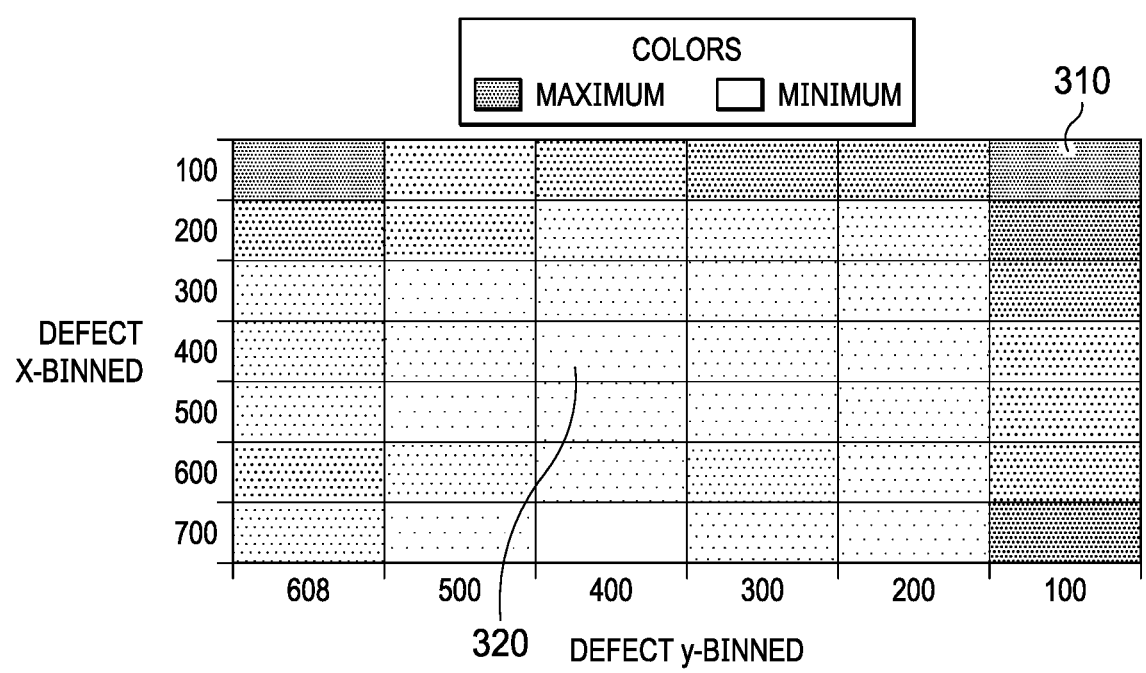
FIG. 3 is a plot diagram showing an example two-dimensional distribution of defect densities across the surface of an example micromirror array in a MEMS device.

FIG. 3 is a plot diagram showing an example two-dimensional distribution of defect densities across the surface of an example micromirror array in a MEMS device. For example, a DMD device 100 can include a bondline structure 115 in which the bondline structure is closer to the top row (e.g., by a distance 100 in a "y" direction) and the rightmost row (e.g., by a distance 100 in an "x" direction). In contrast, the bondline structure is farther from the bottom row (e.g., by a distance 700 in the "y" direction) and the leftmost column (e.g., by a distance 700 in the "x" direction).

Selected blocks (e.g., blocks 310 and 320) show example defect densities resulting from reactant species migration and diffusion from a bondline structure such as described hereinabove. Darker shades of blocks (such as block 310) indicate higher densities of defects, whereas lighter shades of blocks (such as block 320) indicate lower densities of defects. The gradient of defect densities decreases according to a diffusion gradient of gaseous reactant species (e.g., through the headspace 195 of the device) and a distance from a source of potential contaminants. Accordingly, higher densities of defects occur in locations closer to the bondline structure.

If each example block (e.g., 310 or 320) represents a rectangular array of ten or more micromirrors in each dimension, a higher level of defects is observed for the micromirrors located closer to the periphery of the device, and a lower levels of defects is observed for the micromirrors located farther from the bondline structure.

As described herein, the higher densities of failure are caused by a higher accretions of reactant species (e.g., indium species) migrating from (or through) the bondline structure. The reactant species usually accrete in higher concentrations closer to the bondline structure (e.g., due to opportunistic chemical reactions). The higher accretions (e.g., accumulations) of contamination can cause a greater incidence of adverse chemical reactions involving a lubricant deposited on surfaces of micromirrors located in a headspace 195 of a device 400, described hereinbelow with reference to FIG. 4A. The higher levels of accreted contamination can result in increased probabilities of degraded performance and failures of affected components.

Figure 4A:
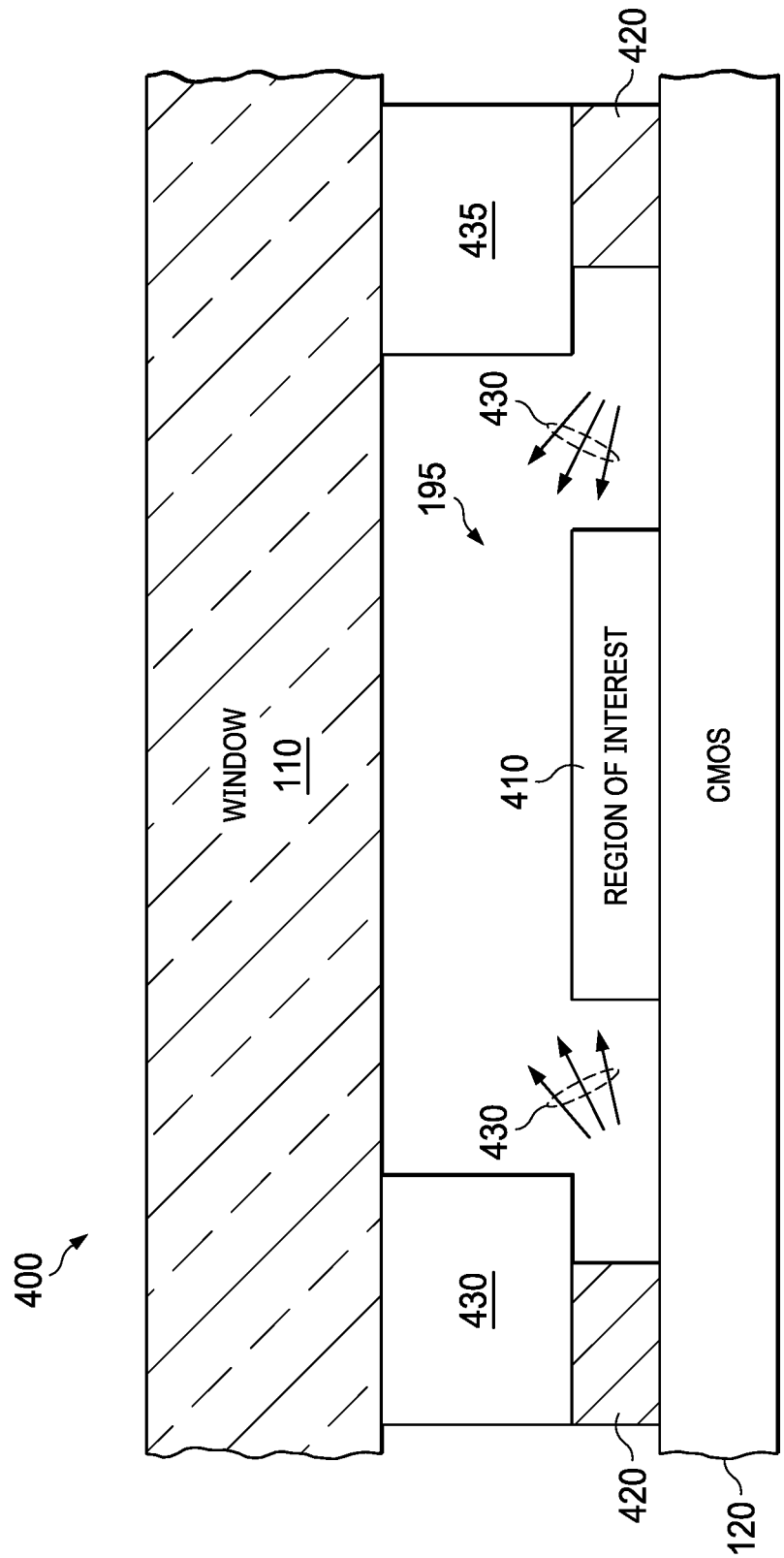
FIG. 4A is a cross-sectional diagram of an elevational view of a portion of an example two-substrate assembly of a device.

FIG. 4A is a cross-sectional diagram of an elevational view of a portion of an example two-substrate assembly of a device 400. For example, the device 400 includes: a first substrate 120 and a second substrate 110; interposers 430 and 435; and bondline structures 420. The interposers 430 and 435 are cantilevered with respect to a respective bondline structure 420 and the second substrate 110 (e.g., arranged to form a window through which light illuminates micromirrors).

The substrate 110, the substrate 120, the interposers 430 and 435 and the bondline structure(s) 420 are arranged as a stack to seal the headspace 195. The inner surfaces of the interposers 430 and 435 are the peripheral boundary (e.g., outer edges) of a cavity that includes the headspace 195 and the region of interest 410. The region of interest 410 can be a region in which delicate MEMS devices, such as the micromirror devices, can be arranged. Potential contaminants 430 can migrate and diffuse along a diffusion gradient, such that greater accretions of such contaminants occur on surfaces of the region of interest 410 closer to the bondline structure(s) 420. Such accretions jeopardize proper operation of the contaminated MEMS devices.

Figure 4B:
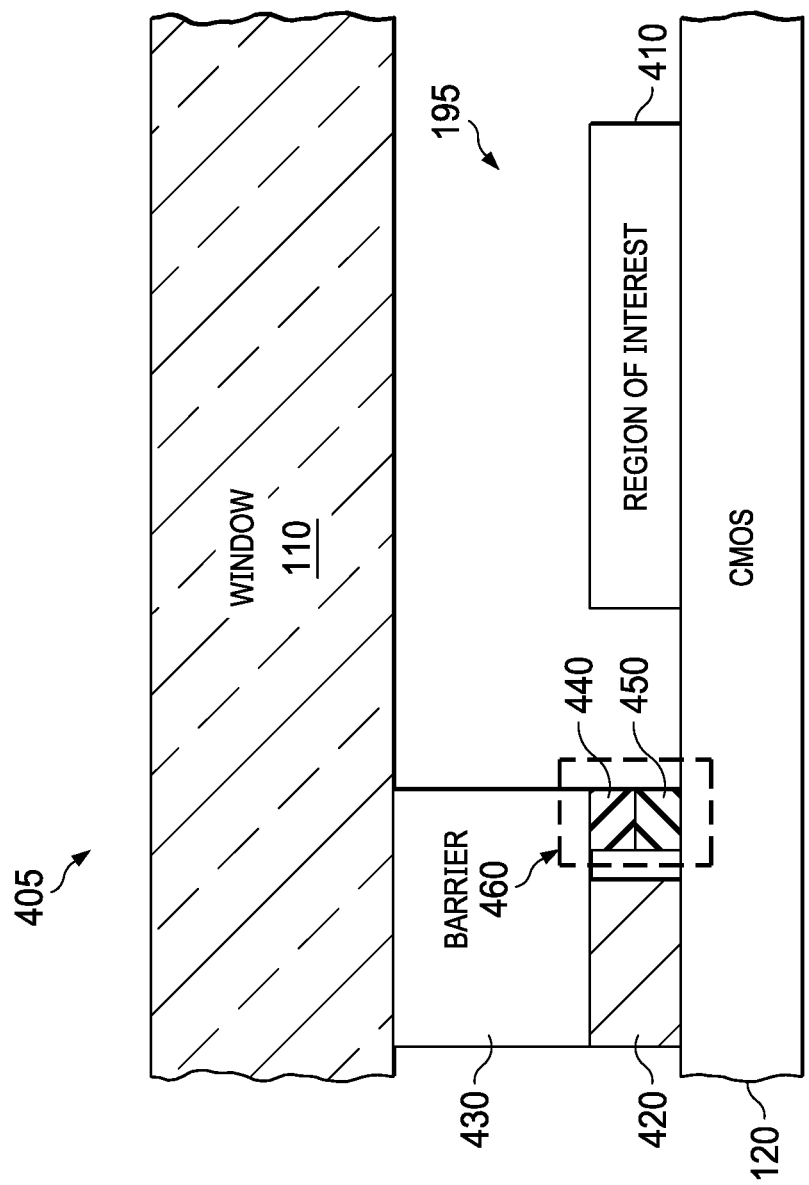
FIG. 4B is a cross-sectional elevational view of an example two-substrate assembly of a device that includes an example diffusion barrier.

FIG. 4B is a cross-sectional elevational view of an example two-substrate assembly of a device 405 that includes an example diffusion barrier 460. For example, the diffusion barrier 460 (shown in cross-section) can extend between an inside portion of a bondline structure 420 and the headspace 195 in three-dimensional space along an outside periphery (e.g., peripheral boundary) of the headspace 195, such that the headspace 195 is encircled (e.g., continuously or partially) by the diffusion barrier 460. Further, the diffusion barrier 460 itself is enclosed by the bondline structure. The diffusion barrier 460 can be a quadrilateral structure (e.g., when viewed in top view).

As described herein, the diffusion barrier 460 includes surfaces arranged to reduce and/or limit the incidence of diffusion of reactant species against otherwise diffusing from the bondline structure 420 and potentially contaminating the region of interest 410. The diffusion barrier 460 extends lineally (e.g., in a third dimension perpendicular to the plane of the cross sectional view of the device 405) between the bondline structure 420 and the headspace 195 of FIG. 4B. The diffusion barrier 460 can include surfaces of the interposer 430, the barrier extensions 440 and 450 and the first substrate 420. The included surfaces are positioned between the bondline structure 120 and the headspace 195.

Potential contaminants migrating from the bondline structure are blocked by (e.g., surfaces of) a diffusion barrier 460 inwards from and exposed to the bondline structure 420. The interposer 430 is coupled to the first substrate 120 (e.g., via the barrier extensions 440 and 450) independently from the bondline structure 420. Accordingly, the diffusion barrier 460 (e.g., itself) can be free of bonding substances that can contaminate components of the region of interest 410.

The intermediate positioning of the diffusion barrier 460 impedes the migration of potential contaminants between the bondline structure 420 (e.g., from which potential contaminants can escape) and the headspace 195 (e.g., which includes the region of interest 410, which is to be protected from contaminants). For example, the diffusion barrier 460 surface can impede contaminants from the bondline structure 420 from entering the headspace 195 by blocking or otherwise slowing the rate of diffusion of the contaminants from the bondline structure 420 to the headspace 195.

Accordingly, the diffusion barrier 460 need not continuously encircle a periphery of the headspace 195, or need not form a hermetic seal to impede (e.g., block or limit) the migration of potential contaminants.

The diffusion barrier 460 can include a barrier extension 440 (e.g., formed on the interposer 430) and/or a barrier extension 450 (e.g., formed on the first substrate 120). As discussed hereinbelow, the heights of the interposer 430, the barrier extension 440 (if present) and the barrier extension 450 (if present) can vary. The diffusion barrier 460 can be arranged to continuously surround or partially surround (e.g., in top view) the headspace 195 of the device 405. Surfaces of the diffusion barrier 460 adjacent (e.g., proximate, subjacent and/or superjacent) to the bondline structure 420 lessens the concentration of reactant species in locations closer to the region of interest 410, as well as to help protect structures in the region of interest 410 by lessening the incidence of contamination.

The outer surface (which faces the bondline structure 420) of the diffusion barrier 460 surface can include surfaces of at least two of the first substrate 120, the interposer 430, the barrier extension 450, the barrier extension 440 and the substrate 110. One or more surfaces of the extensions 440 and 450 can be formed in response to depositing raised structures or by etching away selected portions of surrounding areas.

The surface of the diffusion barrier 460 extends across the outer faces of the included structures of the diffusion barrier 460, as well as any of the interstices between contacting structures of the diffusion barrier 460. The surfaces of mating surfaces of the structures of the diffusion barrier are usually flat (or planarized to render flat surfaces), which minimizes gaps in the interstices through which reactive species might otherwise traverse.

In a first example, the diffusion barrier 460 includes: the interposer 430; the barrier extension 440; the barrier extension 450; and the substrate 120.

In a second example, the diffusion barrier 460 surface includes: the interposer 430; a selected one of the extensions 440 and 450; and the substrate 120.

In a third example, the diffusion barrier 460 includes: the second substrate 110; the barrier extension 440; the barrier extension 450; and the first substrate 120.

In a fourth example, the diffusion barrier 460 includes: the second substrate 110; a selected one of the extensions 440 and 450; and the first substrate 120.

Figure 5:
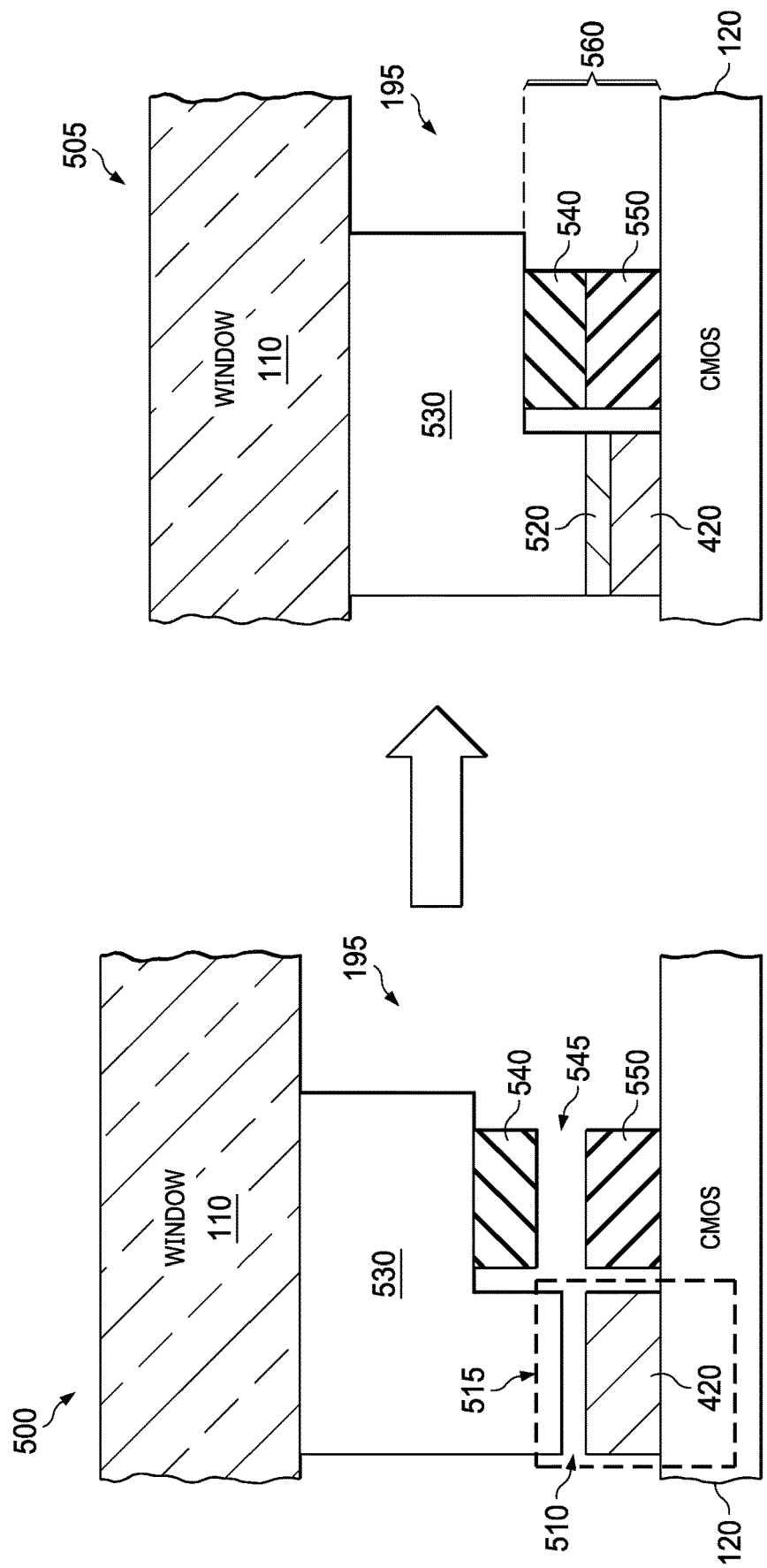
FIG. 5 is a cross-sectional diagram of first and second states of assembly of an example bonding to form an example non-pliant structure diffusion barrier surface.

FIG. 5 is a cross-sectional diagram of first and second states of assembly of an example bonding to form an example non-pliant structure diffusion barrier surface. For example, a first state 500 shows a second wafer assembly (e.g., which includes a second substrate 110, interposer 530 and a barrier extension 540) and a first wafer assembly (e.g., which includes a first substrate 120, a bondline structure 420 and a barrier extension 550). The interposer 530 and the bondline structure 420 are arranged to bond the first and second wafer assemblies into a unified wafer assembly, such as the example unified wafer assembly shown by the second state 505.

The first state 500 shows the first substrate 120 and the second substrate 110 before being bonded together along the bondline structure 420. Surfaces of the interposer 530 facing the second substrate 110 include two (e.g., usually different) elevations: a first elevation that includes a mating surface to bond with structures to form a hermetic seal; and a second elevation that includes a mating surface to form the diffusion barrier 560. The extent of the elevations can be described with respect to a distance to an upper or lower substrate or a distance to a mating surface (e.g., where the distance can change during a bonding process).

The interposer 530 first elevation defines a gap 510, which is a space separating the first elevation mating surface of the interposer 530 and the facing surface of the bondline structure 420. As shown in the second state 505, the gap 510 is completely closed during formation of a bond along the bondline structure 420. The bond formed along the bondline structure 420 bonds the interposer 530 of a second wafer assembly (which can include the second substrate 110) to structures of a first wafer assembly (which can include the first substrate 120). In other examples, die-level bonding processes and structures can replace the wafer-level bonding processes and structures described herein.

The interposer 530 second elevation mating surface defines a first extent (e.g., upward edge) of the gap 545. The mating surface of the second elevation is of an elevation sufficient to form (or to mount) a barrier extension 540. The barrier extension 540, if present, can be mounted on (or integrally formed as a portion of) the interposer 530, such that the barrier extension 540 contacts the barrier extension 550 (or the first substrate 120 itself) mounted and/or formed on the first wafer assembly.

The upper surface of the barrier extension 550 initially defines a second extent (e.g., lower edge) of the gap 545. The gap 545 extends around a periphery of the headspace 195 along the locations in which the diffusion barrier 560 is to be formed. As shown in the second state 505, the gap 545 is closed when the barrier extension 540 and the barrier extension 550 are mated (e.g., brought into contact). The extensions 540 and 550 are brought into contact during bonding of the first and second wafer assemblies.

The first wafer assembly is bonded to the second wafer assembly in response to compressive forces directed to progressively urge the first and second wafer assemblies together, such that a bond is formed in conjunction with the bondline structure 420. For example, a gold-indium-gold wafer bond 520 is formed between the interposer 530 and the bondline structure 420. The wafer bond 520 resists tensile forces, which helps prevent separation of the first and second wafer assemblies. Accordingly, the contacting surfaces of the extensions 540 and 550 remain in contact even without the application of bonding substances between facing surfaces of the extensions 540 and 550.

Accordingly, the gap 510 closes completely before the gap 545 is completely closed (e.g., when the surfaces defining the gap 545 touch). For example, when the gap 510 is completely closed (e.g., when the surfaces defining the gap 510 touch), the gap 545 continues to decrease in distance: during such time, the intermetallic region within wafer bond 520 is being formed and reactant species are outgassed. The surfaces of the diffusion barrier 560 facing (e.g., peripherally exposed to) the wafer bond 520 impede the flow of reactant species from the wafer bond 520 against entering the headspace 195.

The formation of the intermetallic region of wafer bond 520 is stopped in response to the complete closure of the gap 545. For example, a surface (e.g., lower surface) of the barrier extension 540 contacts a surface (e.g., upper surface) of the barrier extension 550. When the extensions 540 and 550 contact, the extensions 540 and 550 generate a normal force to oppose the net compressive forces that generate the intermetallic layer. In the example structure of the second state 505, the extensions 540 and 550 are relatively non-pliant such that the closure of the two wafer assemblies is halted (e.g., as a "hard stop" closure), and normal forces (e.g., opposing the applied compressive forces) increase.

In an example, a change in the net compressive force can be detected with sensors to monitor and control the application of the wafer bonding forces. When a change in the net applied forces (e.g., resulting from the hard stop) is detected, the compressive pressure applied to form the wafer bond 520 can be reduced. The extensions 540 and 550 contact each other with a hard stop (e.g., contacting surfaces), such that diffusion barrier 560 includes surfaces to impede reactant species against otherwise directly entering the headspace 195.

The bonding substances of wafer bond 520 can release potential contaminants long after the bonding process is completed. In an example where the interposer 530 is bonded to the first substrate 120 by a gold-indium-gold bond, an intermetallic region is formed within the wafer bond 520. The intermetallic region within wafer bond 520 can release the reactant species indium over time (e.g., even after singulation and deployment of the joined wafer assemblies in customer devices).

Figure 6:
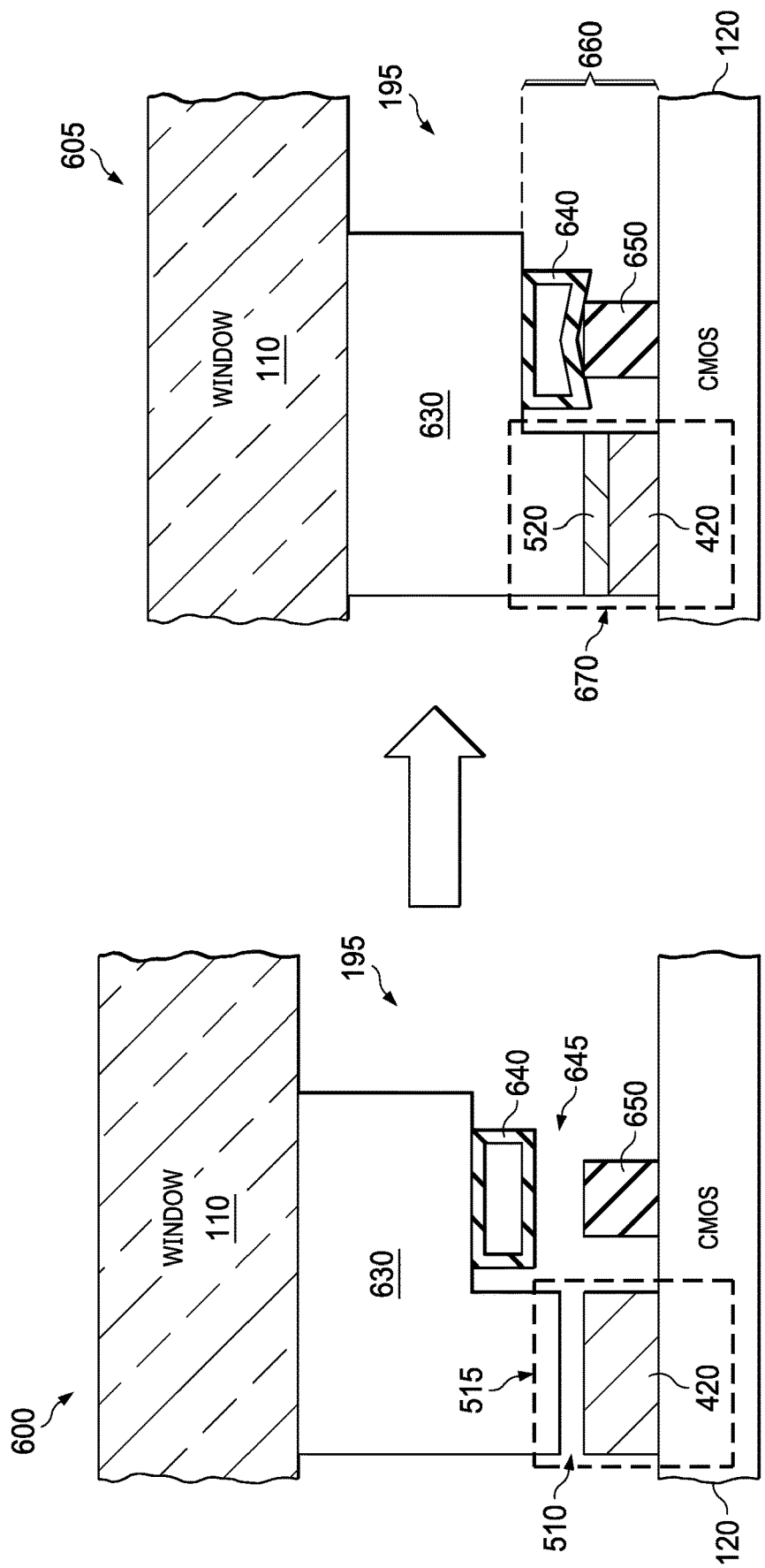
FIG. 6 is a cross-sectional diagram of first and second states of assembly of an example bonding to form an example closed-pliant-structure diffusion barrier surface.

FIG. 6 is a cross-sectional diagram of first and second states of assembly of an example bonding to form an example closed-pliant-structure diffusion barrier surface. For example, a first state 600 shows a second wafer assembly (e.g., which includes a second substrate 110, interposer 630 and a barrier extension 640) and a first wafer assembly (e.g., which includes a first substrate 120, a bondline structure 420 and a barrier extension 650). The interposer 630 and the bondline structure 420 are arranged to bond the first and second wafer assemblies into a unified wafer assembly, such as the example unified wafer assembly shown by the second state 605.

The first state 600 shows the first substrate 120 and the second substrate 110 before being bonded together along the bondline structure 420. The surfaces of the interposer 630 facing the second substrate 110 include two (e.g., usually different) elevations: a first elevation that includes a mating surface to bond with structures to form a hermetic seal; and a second elevation that includes a mating surface to form the diffusion barrier 660.

The interposer 630 first elevation defines a gap 510, which is the space separating the first elevation mating surface of the interposer 630 and the facing surface of the bondline structure 420. As shown in the second state 605, the gap 510 is completely closed during formation of a bond along the bondline structure 420. The bond formed along the bondline structure 420 bonds the interposer 630 of a second wafer assembly to structures of a first wafer assembly (which can include the first substrate 120).

The interposer 630 second elevation mating surface defines a first extent (e.g., upward edge) of the gap 645. The mating surface of the second elevation is of an elevation sufficient to form (or to mount) a barrier extension 640. The barrier extension 640, if present, can be mounted on or integrally formed as a portion of the interposer 630, such that the barrier extension 640 contacts the barrier extension 650 (or the first substrate 120 itself) mounted and/or formed on the first wafer assembly. The facing surfaces of the barrier extension 640 (of state 600) and the barrier extension 650 initially define the gap 645.

The barrier extension 640 (of both states 600 and 605) can be a pliant microstructure region formed on the first substrate 120 (or, for example, the second substrate 110). The barrier extension 640 is arranged to include an internal closed aperture that can be compressively deformed when contacting the barrier extension 650 formed on the second substrate 110. The barrier extension 640 can be formed on a suitable structure such as a semiconductor substrate, silicon structure, or a glass substrate. Either (or both) of the extensions 640 and the barrier extension 650 can be constructed as a pliant structure. An applied force to bond the top and bottom wafer assemblies is controlled to establish a controlled distance between the second substrate 110 and the first substrate 120.

As shown in the second state 605, the gap 645 is closed by bringing together the contacting surfaces of the barrier extension 640 and the barrier extension 650 in response to compressive forces progressively urging the first and second wafer assemblies towards each other. As the compressive forces are applied (e.g., after the surfaces of the barrier extension 640 and the barrier extension 650 contact each other), the barrier extension 640 (e.g., being pliant) deforms.

For example, a gold-indium-gold wafer bond 520 is formed between the interposer 630 and the bondline structure 420. The wafer bond 520 resists tensile forces, which helps prevent separation of the first and second wafer assemblies. Accordingly, the contacting surfaces of the extensions 640 and 650 remain in contact even without bonding substances being deposited between facing surfaces of the barrier extension 640 and 650 contact each other), the barrier extension 640 (e.g., being pliant) deforms (e.g., being compressed, as a compressed spring) and exerts a force against the barrier extension 650 to maintain a closure of the gap 645.

After inter-wafer bonding (e.g., curing of the bonding substances), the barrier extension 640 continues to exert a force on the surface of the barrier extension 650. (The force is opposed, for example, by the bonding force of the gold-indium-gold intermetallic structure of the wafer bond 520.) The continued force exerted by barrier extension 640 of state 605 maintains contaminate-obstructing properties of the diffusion barrier 660 surface. The barrier extension 640 of state 605 itself does not introduce additional potential contaminants, for example, in contrast against the contaminants introduced by bonding substances of the intermetallic structure 520 to form a hermetic seal.

The diffusion barrier 660 surface includes portions of surfaces of the interposer 630 (and/or the second substrate 110), the barrier extension 640 of state 605, the barrier extension 650 and the substrate 120. The diffusion barrier 660 surface impedes the amount of reactant species emanating from sources within region 670 from entering the headspace 195 (e.g., after the bonding process). The diffusion barrier 660 surface can extend partially around or completely around the periphery of the headspace 195.

Figure 7:
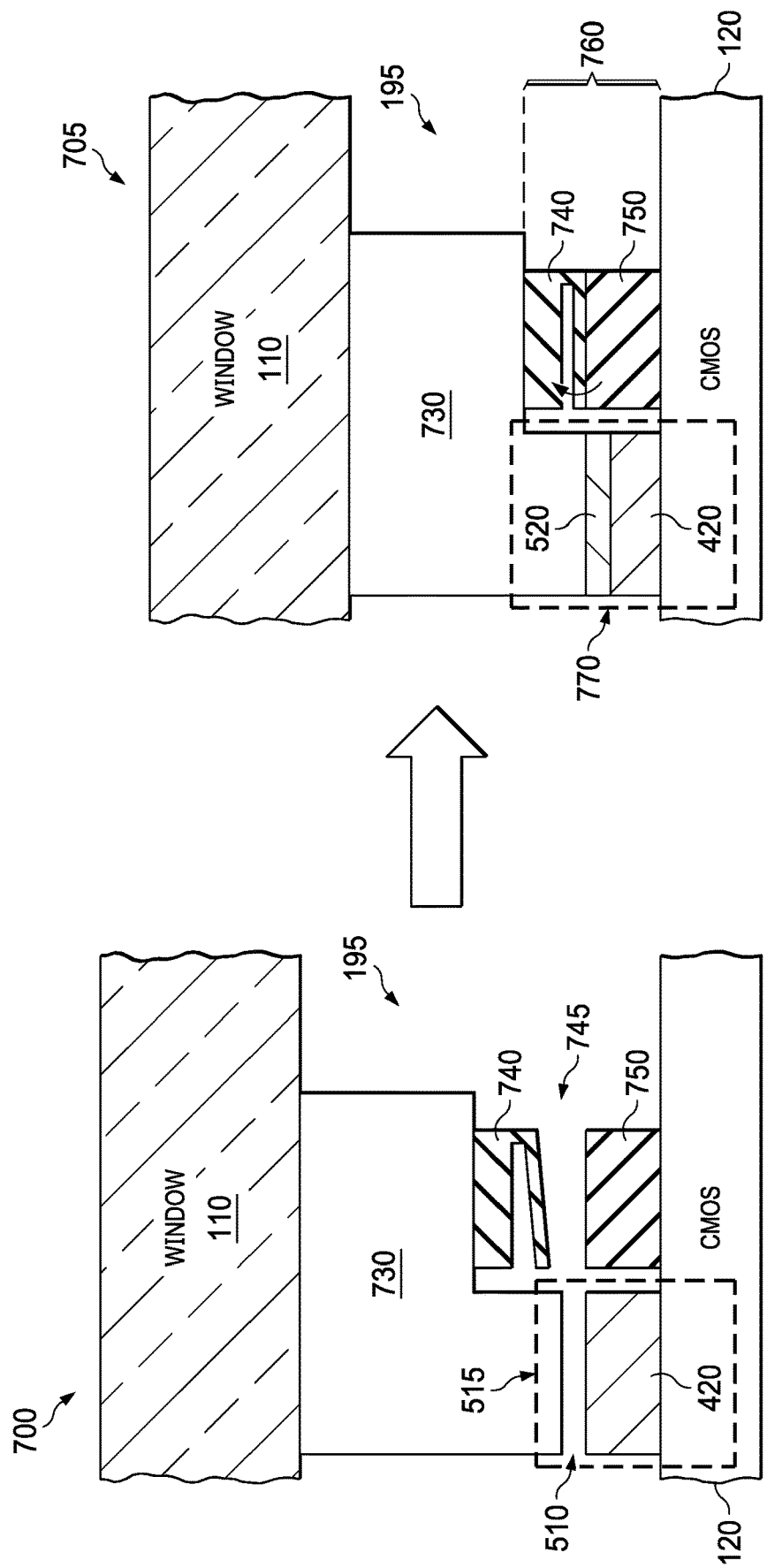
FIG. 7 is a cross-sectional diagram of first and second states of assembly of an example bonding to form an example open-pliant-structure diffusion barrier surface.

FIG. 7 is a cross-sectional diagram of first and second states of assembly of an example bonding to form an example open-pliant-structure diffusion barrier surface. For example, a first state 700 shows a second wafer assembly (e.g., which includes a second substrate 110, interposer 730 and a barrier extension 740) and a first wafer assembly (e.g., which includes a first substrate 120, a bondline structure 420 and a barrier extension 750). The interposer 730 and the bondline structure 420 are arranged to bond the first and second wafer assemblies into a unified wafer assembly, such as the example unified wafer assembly shown by the second state 705.

The first state 700 shows the first substrate 120 and the second substrate 110 before being bonded together along the bondline structure 420. The surfaces of the interposer 730 facing the second substrate 110 include two (e.g., usually different) elevations: a first elevation that includes a mating surface to bond with structures to form a hermetic seal; and a second elevation that includes a mating surface to form the diffusion barrier 760.

The interposer 730 first elevation defines a gap 510, which is the space separating the first elevation mating surface of the interposer 730 and the facing surface of the bondline structure 420. As shown in the second state 705, the gap 510 is completely closed during formation of a bond along the bondline structure 420. The bond formed along the bondline structure 420 bonds the interposer 730 of a second wafer assembly to structures of a first wafer assembly (which can include the first substrate 120).

The interposer 730 second elevation mating surface defines a first extent (e.g., upward edge) of the gap 745. The mating surface of the second elevation is of an elevation sufficient to form (or mounting) a barrier extension 740. The barrier extension 740, if present, can be mounted on and/or integrally formed as a portion of the interposer 730, such that the barrier extension 740 contacts the barrier extension 750 (or the first substrate 120 itself) mounted or formed on the first wafer assembly. The closest surfaces of the barrier extension 740 (of state 700) and the barrier extension 750 initially define the gap 745.

The barrier extension 740 (of both states 700 and 705) can be a pliant microstructure region formed on the first substrate 120 (or, for example, the second substrate 110). The barrier extension 740 is a cantilevered leafspring-like structure (e.g., "diving board-like" structure), which is compressed in response to contacting the barrier extension 750 formed on the second substrate 110. The barrier extension 740 includes a flexible arm arranged to define an internal open aperture that can be compressively deformed (e.g., bent) as the barrier extension 740 is forced against the barrier extension 750 formed on the first substrate 120. The open aperture includes an unsupported side (e.g., either facing outwards towards a die boundary, or facing inwards towards the region of interest 410, for example). Accordingly, the barrier extension 740 compressibly resists compressive forces directed to progressively urge the first and second wafer assemblies together. Either (or both) of the extensions 740 and the barrier extension 750 can be constructed as an open pliant structure. A level of force to bond the top and bottom wafer assemblies is controlled to establish a controlled distance between an extent of the second substrate 110 and an extent the first substrate 120.

As shown in the second state 705, the gap 745 is closed by bringing together the contacting surfaces of the barrier extension 740 and the barrier extension 750 in response to compressive forces applied to progressively urge the first and second wafer assemblies towards each other. As the compressive forces to bond are applied (e.g., after the surfaces of the barrier extension 740 and the barrier extension 750 contact each other), the barrier extension 740 (e.g., being pliant) deforms (e.g., being compressed, as a compressed leafspring).

For example, a gold-indium-gold wafer bond 520 is formed between the interposer 730 and the bondline structure 420. The wafer bond 520 resists tensile forces, which helps prevent separation of the first and second wafer assemblies. Accordingly, the contacting surfaces of the extensions 740 and 750 remain in contact even without bonding substances being deposited between facing surfaces of the barrier extension 740 and 750 contact each other), the barrier extension 740 (e.g., being pliant) deforms (e.g., being compressed, as a compressed spring) and exerts a force against the barrier extension 750 to maintain a closure of the gap 745.

After inter-wafer bonding (e.g., after curing of the bonding substances), the barrier extension 740 continues to exert a force on the surface of the barrier extension 750. (The force is opposed, for example, by the bonding force of the gold-indium-gold intermetallic structure of the wafer bond 520.) The continued force exerted by barrier extension 740 of state 705 maintains contaminate-obstructing properties of the diffusion barrier 760 surface. The barrier extension 740 of state 705 itself does not introduce additional potential contaminants, for example, in contrast with the contaminants introduced by bonding substances of the intermetallic structure 520 to form a hermetic seal.

The diffusion barrier 760 surface includes portions of surfaces of the interposer 730 (and/or the second substrate 110), the barrier extension 740 of state 705, the barrier extension 750 and the substrate 120. The diffusion barrier 760 surface impedes a portion of reactant species emanating from sources within region 770 against entering the headspace 195 (e.g., after the bonding process). The diffusion barrier 760 surface can extend partially around or completely around the periphery of the headspace 195.

Figure 8:
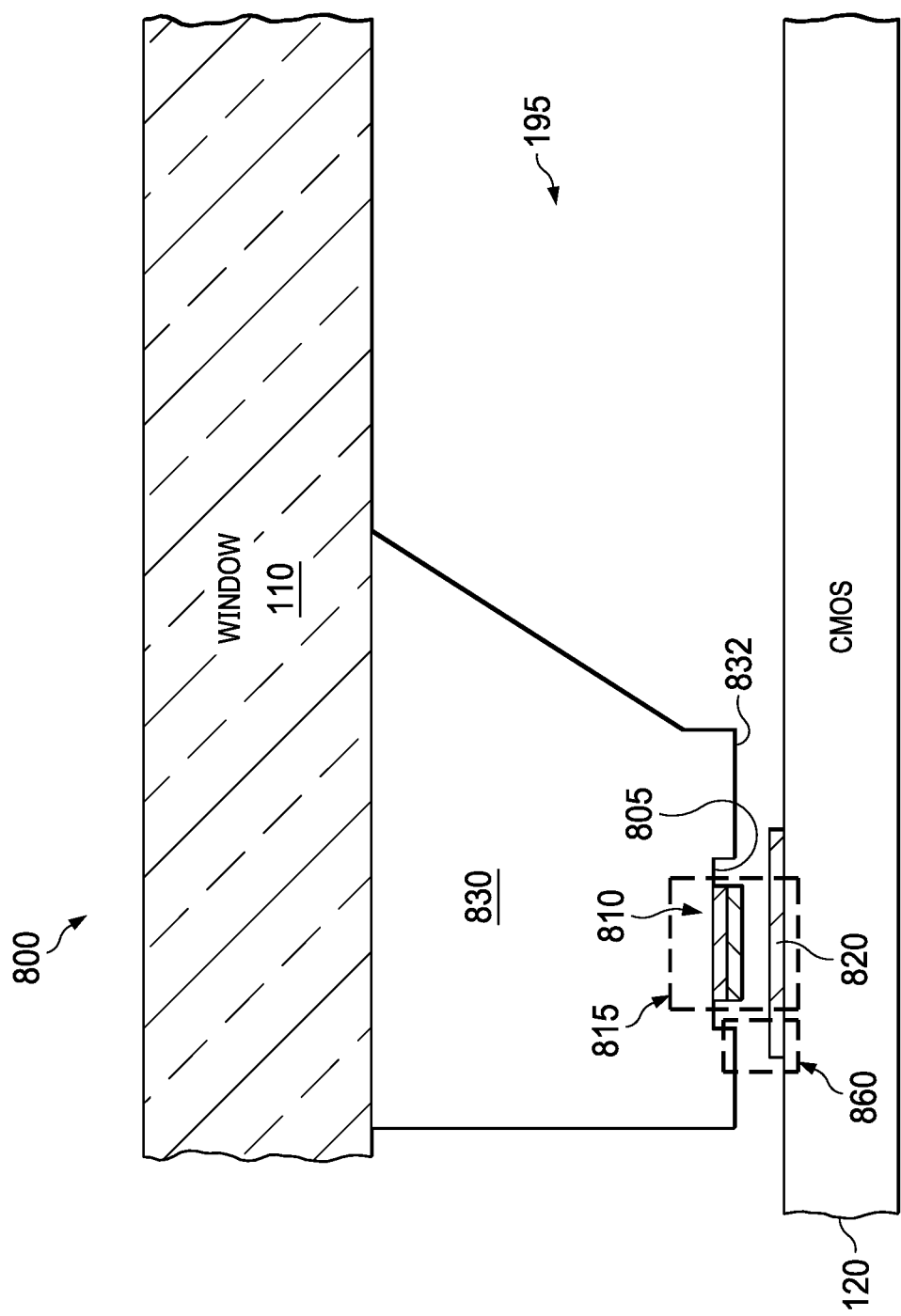
FIG. 8 is a cross-sectional diagram of an example closed-recess diffusion barrier structure arranged to contact a second-substrate deposition.

FIG. 8 is a cross-sectional diagram of an example closed-recess diffusion barrier structure arranged to contact a second-substrate deposition. For example, a structure 800 includes a first wafer assembly (e.g., which includes a second substrate 110, an interposer 830 and a gold-indium stack 810 arranged in a closed recess 805) and a second wafer assembly (e.g., which includes a first substrate 120 and a gold deposition 820).

Structure 800 shows a two-wafer assembly of a device before bonding the first substrate 120 to the second substrate 110 along a (to-be-formed) bondline structure 815. The gold-indium stack 810 is deposited in a recess 805 of the interposer 830. The recess 805 is a depression having sidewalls (e.g., extensions), which can be formed by etching or by depositing a structure on the interposer 930. The recess 805 extends around the periphery of headspace, such that the bondline structure 815 hermetically seals the headspace 195 after bonding.

As the first wafer assembly and the second wafer assembly are compressed together, a first area of contact occurs between the indium layer of the gold-indium stack 810 and the gold deposition 820. For example, pressure is applied to force the indium layer against the gold deposition 820, such that an intermetallic layer is formed therebetween to bond and hermetically seal the headspace 195.

Forcing the indium into the gold deposition 820 also causes a sideways (e.g., orthogonal to the direction of applied forces) extrusion of the indium (of the gold-indium stack 810) and a sideways extrusion of gold (of the gold deposition 820). Interior sidewalls of the (e.g., barrier) extension 832 help limit the extent of the sideways extrusion of indium and/or gold. For example, the sidewalls of the extension 832 block the indium from spreading directly onto the extension 832. Blocking the spread of indium prevents a source of indium from contaminating an area reserved for formation of a diffusion barrier (e.g., in region 860). The prevention of the contamination of region 860 improves the ability of the diffusion barrier to block the migration of indium (a reactant species) into the headspace 195 (e.g., because a formed diffusion barrier itself does not outgas indium).

After the first area contact occurs, a second area of contact occurs in the region 860. The region 860 includes facing surfaces of the extension 832 (of the interposer 830) and the gold deposition 820. For example, the gold deposition 820 deposited on the first substrate 120 is engaged along both inner and outer edge portions thereof by the extensions 832 as the first and second wafer assemblies are being brought together. When the first and second wafer assemblies are jointly compressed and heated, the gold deposition 820 on the substrate 120 deforms and conforms to the mating surface of extension 832. Accordingly, an inner diffusion barrier includes surfaces of the interposer 830, extension 832, the gold deposition 820 and the substrate 120, such that reactant species are impeded against migration into the headspace 195. An outer diffusion barrier in region 860 is also arranged to impede reactant species against migrating into an environment outside the enclosure formed by the interposer 832 (e.g., where the outside environment can contain structures capable of being degraded by the reactant species). Accordingly, the interposer 830 can include an extension 832, where the extension is arranged to couple with (e.g., contact) the first substrate independently of the bondline structure. The interposer 820 is also arranged to couple with the first substrate via the bondline structure 815 (e.g., via a portion of the gold layer 820 and gold-indium stack 810).

In another example, the extension 832 and the gold deposition 820 contact each other before the contact occurs between the indium layer of the gold-indium stack 810 and the gold deposition 820. For example, the gold of the gold deposition 820 is malleable and deforms in response to compressive forces applied to the first and second wafer assemblies (such that a diffusion barrier is formed). The deformation of gold accommodates the movement of the first wafer assembly towards the second wafer assembly. Accordingly, the indium layer of the gold-indium stack 810 also contacts the gold deposition 820, such that a hermetic seal can be formed.

Figure 9:
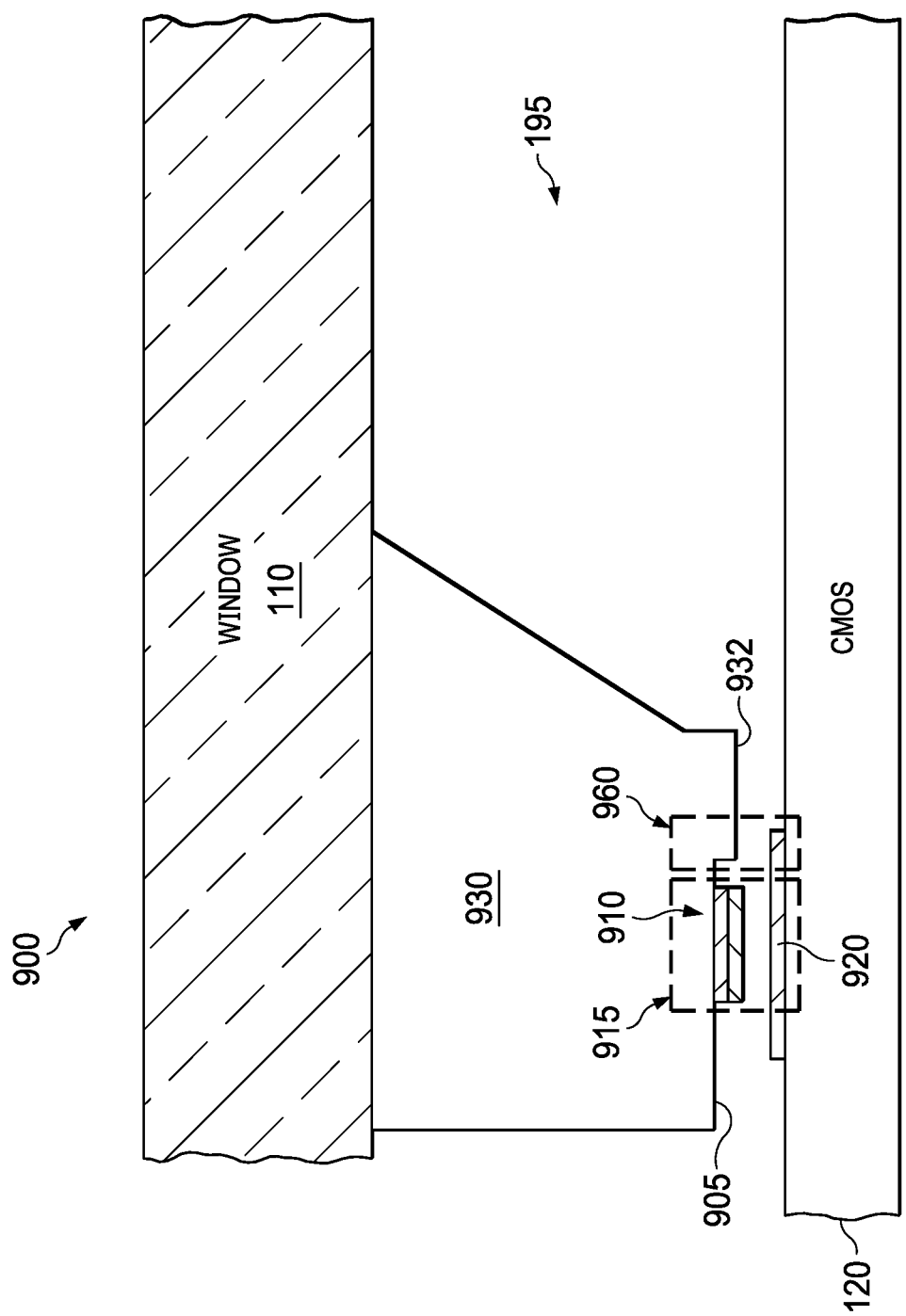
FIG. 9 is a cross-sectional diagram of an example open-recess diffusion barrier structure arranged to contact a second-substrate deposition.

FIG. 9 is a cross-sectional diagram of an example open-recess diffusion barrier structure arranged to contact a second-substrate deposition. For example, a structure 900 includes a first wafer assembly (e.g., which includes a second substrate 110, an interposer 930 and a gold-indium stack 910 arranged in an open recess 905) and a second wafer assembly (e.g., which includes a first substrate 120 and a gold deposition 920).

Structure 900 shows a two-wafer assembly of a device before bonding the first substrate 120 to the second substrate 110 along a (to-be-formed) bondline structure 915. The gold-indium stack 910 is deposited in a recess 905 of the interposer 930. The recess 905 is a depression having an inner sidewall, which can be formed by etching or by depositing a structure on the interposer 930. The recess 905 extends around the periphery of headspace, such that the bondline structure 915 hermetically seals the headspace 195 after bonding.

As the first wafer assembly and the second wafer assembly are compressed together, a first area of contact occurs between the indium layer of the gold-indium stack 910 and the gold deposition 920. For example, pressure is applied to press the indium layer against the gold deposition 920, such that an intermetallic layer is formed therebetween to bond and hermetically seal the headspace 195.

After the first area contact occurs, a second area of contact occurs in the region 960. The region 960 includes facing surfaces of the extension 932 (of the interposer 930) and the gold deposition 920. For example, the gold deposition 920 deposited on the first substrate 120 is engaged along an inner portion thereof by the extension 932 as the first and second wafer assemblies are being brought together. When first and second wafer assemblies are jointly compressed and heated, the gold deposition 920 on the substrate 120 deforms and conforms to the mating surface of extension 932. Accordingly, a diffusion barrier in region 960 includes surfaces of the interposer 930, extension 932, the gold deposition 920 and the substrate 120.

Figure 10:
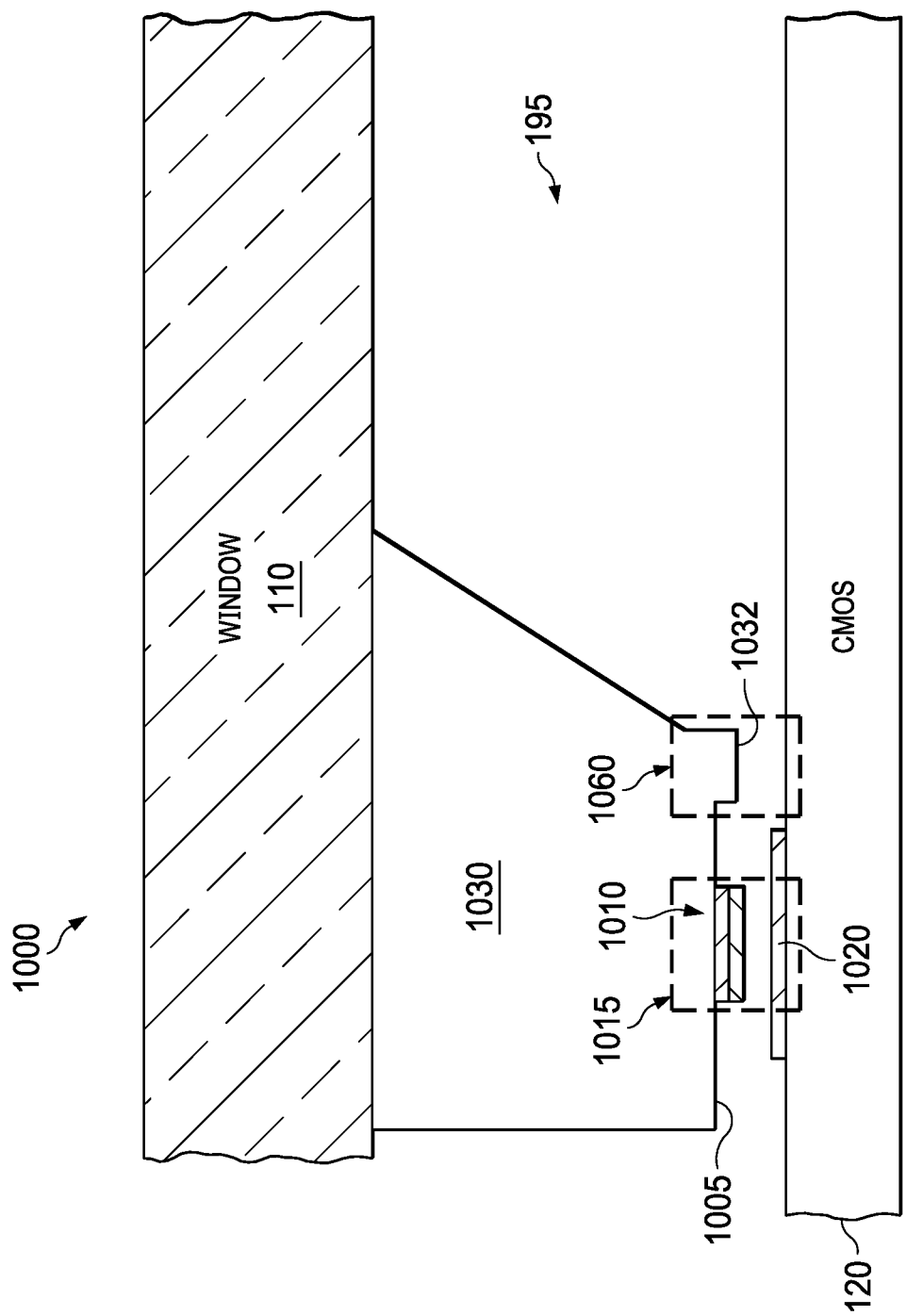
FIG. 10 is a cross-sectional diagram of an example open-recess diffusion barrier structure arranged to contact a second-substrate.

FIG. 10 is a cross-sectional diagram of an example open-recess diffusion barrier structure arranged to contact a second-substrate. For example, a structure 1000 includes a first wafer assembly (e.g., which includes a second substrate 110, an interposer 1030 and a gold-indium stack 1010 arranged in an open recess 1005) and a second wafer assembly (e.g., which includes a first substrate 120 and a gold deposition 1020).

Structure 1000 shows a two-wafer assembly of a device before bonding the first substrate 120 to the second substrate 110 along a (to-be-formed) bondline structure 1015. The gold-indium stack 1010 is deposited in a recess 1005 of the interposer 1030. The recess 1005 is a depression having an inner sidewall, which can be formed by etching or by depositing a structure on the interposer 1030. The recess 1005 extends around the periphery of headspace, such that the bondline structure 1015 hermetically seals the headspace 195 after bonding.

As the first wafer assembly and the second wafer assembly are compressed together, a first area of contact occurs between the indium layer of the gold-indium stack 1010 and the gold deposition 1020. For example, pressure is applied to press the indium layer against the gold deposition 1020, such that an intermetallic layer is formed therebetween to bond and hermetically seal the headspace 195.

After the first area contact occurs, a second area of contact occurs in the region 1060. The region 1060 includes facing surfaces of the extension 1032 (of the interposer 1030) and the substrate 120. For example, the first substrate 120 is engaged by the extensions 1032 as the first and second wafer assemblies are being brought together. Neither the extension 1032 nor the first substrate 120 are pliant, such that the extension 1032 functions as a "hard stop" during the bonding process. Accordingly, a diffusion barrier in region 1060 is formed by surfaces of the interposer 1030, extension 1032 and the substrate 120.

Figure 11:
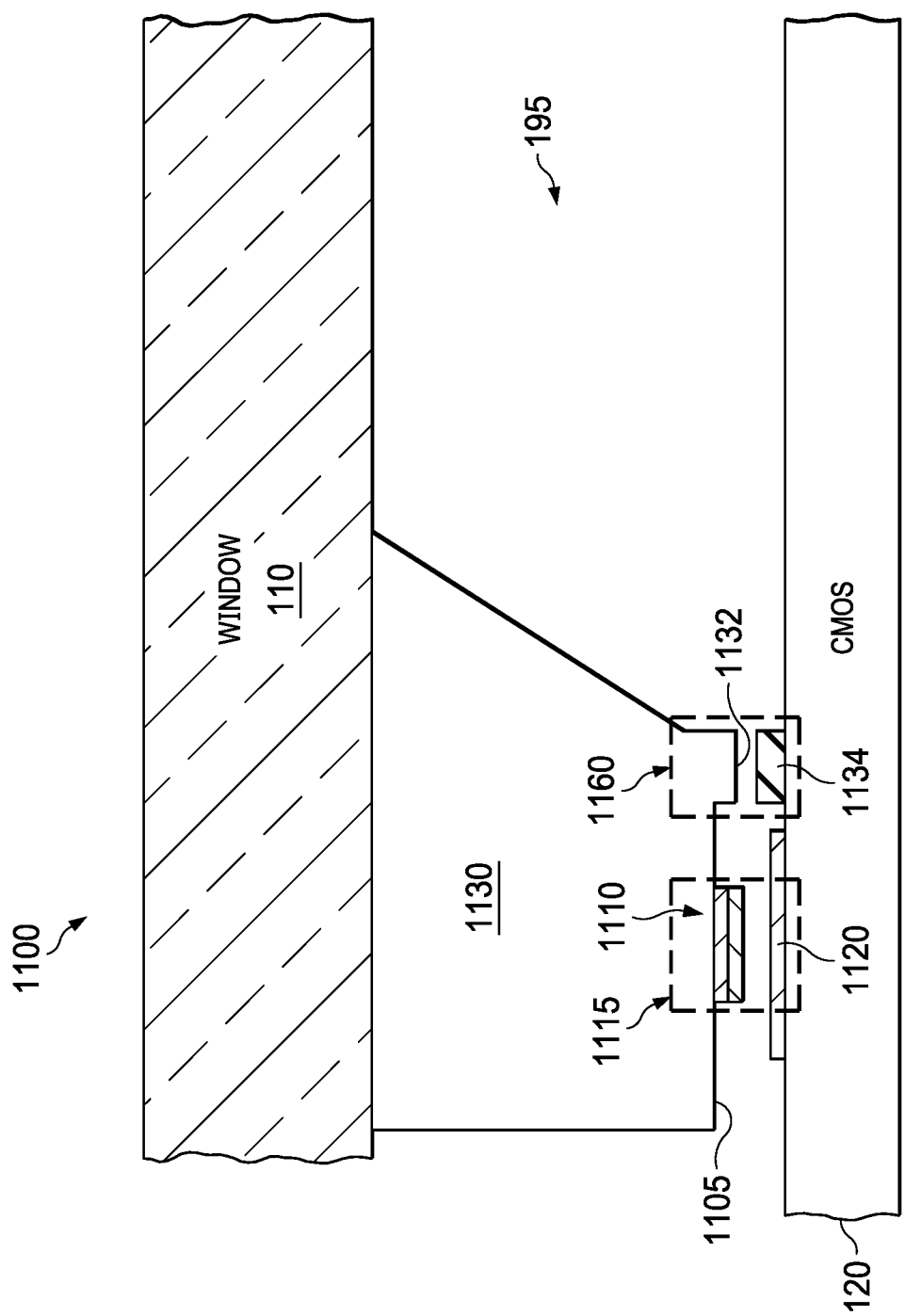
FIG. 11 is a cross-sectional diagram of an example open-recess diffusion barrier structure arranged to contact a second-substrate extension.

FIG. 11 is a cross-sectional diagram of an example open-recess diffusion barrier structure arranged to contact a second-substrate extension. For example, a structure 1100 includes a first wafer assembly (e.g., which includes a second substrate 110, an interposer 1130 and a gold-indium stack 1110 arranged in an open recess 1105) and a second wafer assembly (e.g., which includes a first substrate 120 and a gold deposition 1120).

Structure 1100 shows a two-wafer assembly of a device before bonding the first substrate 120 to the second substrate 110 along a (to-be-formed) bondline structure 1115. The gold-indium stack 1110 is deposited in a recess 1105 of the interposer 1130. The recess 1105 is a depression having an inner sidewall, which can be formed by etching or by depositing a structure on the interposer 1130. The recess 1105 extends around the periphery of headspace, such that the bondline structure 1115 hermetically seals the headspace 195 after bonding.

As the first wafer assembly and the second wafer assembly are compressed together, a first area of contact occurs between the indium layer of the gold-indium stack 1110 and the gold deposition 1120. For example, pressure is applied to press the indium layer against the gold deposition 1120, such that an intermetallic layer is formed therebetween to bond and hermetically sealing the headspace 195.

After the first area contact occurs, a second area of contact occurs in the region 1160. The region 1160 includes facing surfaces of the extension 1132 (of the interposer 1130) and the extension 1134 formed on the substrate 120. For example, the extension 1134 is engaged by the extension 1132 as the first and second wafer assemblies are being brought together. The extension 1132 and the extension 1134 are non-pliant, such that the extensions 1132 and 1134 function as a "hard stop" during the bonding process. Accordingly, a diffusion barrier is formed in region 1160 by surfaces of the interposer 1130, extension 1132, extension 1134 and the substrate 120.

Figure 12:
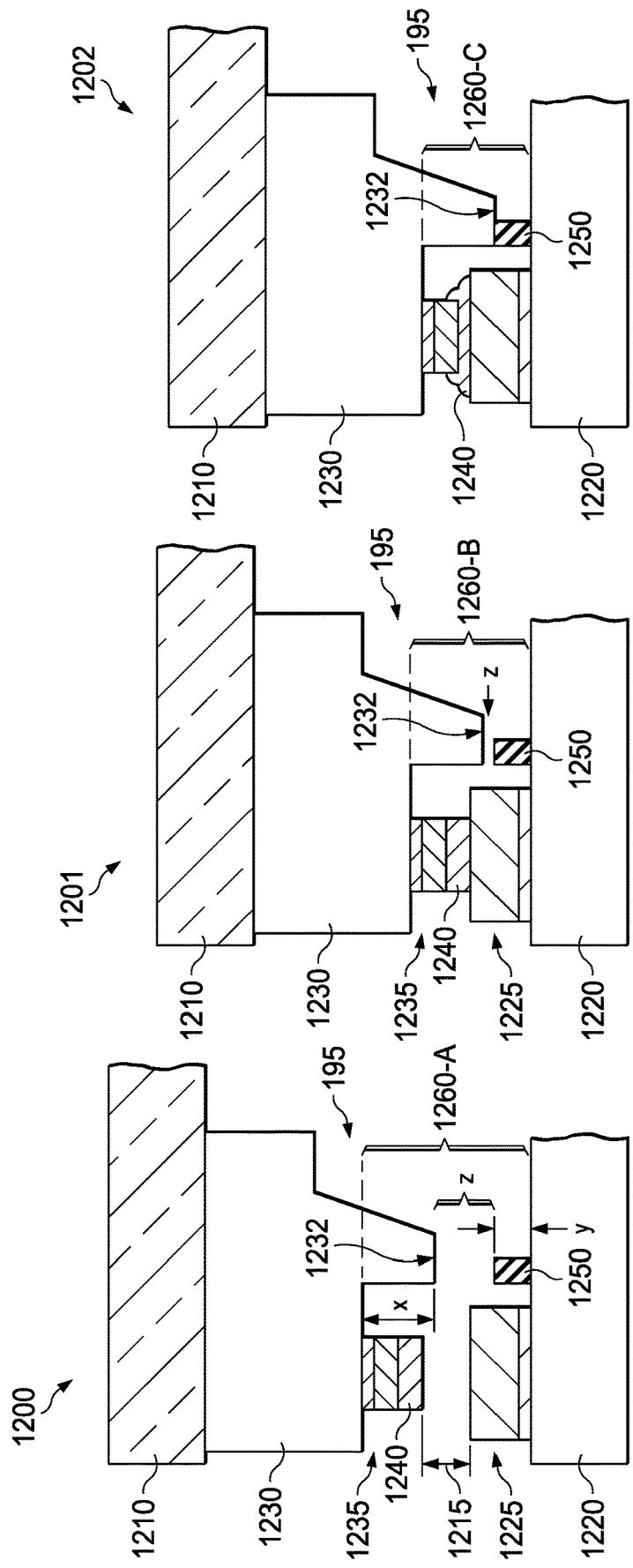
FIG. 12 is a cross-sectional diagram of first, second and third states of assembly of an example open-recess diffusion barrier structure arranged to contact a second-substrate extension.

FIG. 12 is a cross-sectional diagram of first, second and third states of assembly of an example open-recess diffusion barrier structure arranged to contact a second-substrate extension. For example, a first state 1200 shows a first wafer assembly (e.g., which includes a second substrate 1210, interposer 1230 and a bondline structure 1235) and a second wafer assembly (e.g., which includes a first substrate 1220, an extension 1225 and an extension 1250).

The first state 1200 is an initial state showing the first substrate 1220 and the second substrate 1210 before being bonded (e.g., hermetically bonded) together along the bondline structure 1235. The second state 1201 is an intermediary state showing an initial contact of the bondline structure 1235 and the extension 1225 in response to compressive forces (e.g., and heat), which are applied to bond the first and second wafer assemblies. The third state 1202 is a bonded state (e.g., end state) showing the interposer 1230, the extension 1232 and the extension 1250 being arranged to form a diffusion barrier 1260-C.

In the first state 1200, the surfaces of the interposer 1230 facing the second substrate 1210 include two elevation surfaces: a first surface elevation that is arranged to bond to a bondline structure 1235; and a second surface elevation that is arranged to include an extension 1232. The bondline structure 1235 is arranged to bond with structures such as extension 1225 to form a hermetic seal, such as shown in the second state 1201 and the third state 1202.

The extension 1232 can be integrally formed as part of the interposer 1230 or an extension mounted on the interposer 1230 *a*. The extension 1232 is arranged to contact the extension 1250, which closes the aperture "z" to produce a closed diffusion barrier 1260-C, such as shown in the third state 1202.

An aperture "z" of a diffusion barrier 1260-A is arranged between the extension 1232 and the first substrate 1220. In the first state 1200: the extension 1232 extends beyond the interposer 1230 first elevation by a distance "x;" and the extension 1250 extends above the first substrate 1220 by a distance "y," where the distance "z" is the distance (e.g., which is reduced during the bonding process) between the distances "x" and "y."

As the distance "z" is reduced, the gap 1215 is reduced to zero in the second state 1201, such that the indium layer 1240 contacts a gold layer of the extension 1225. As the distance "z" is further reduced (e.g., as the bonding process progresses from the second bonding state 1201 to the third bonding state 1202), the indium layer is deformed, which forms a hermetic seal for bonding and sealing the first and second wafer assemblies.

After a final closure of the bonded first and second wafer assemblies, the distance "z" is reduced to a minimum value. When the minimum value of the aperture of the diffusion barrier 1260-C is zero, the height of the diffusion barrier 1260-C is the sum of "x" and "y."

When the minimum value of the aperture of the diffusion barrier 1260-C is zero, the diffusion barrier 1260-C virtually eliminates a path for migration of indium reactant species from indium layer 1240 to the headspace 195. For example, microscopic-scale channels can exist (e.g., resulting from tolerances in manufacturing) in the interstice between the lower surface of the extension 1232 and the upper surface of the extension 1250. The microscopic-scale channels impede traversal therethrough of indium reactant species because of the restricted channel size.

The extension 1232 (which is the 1230 second elevation) is mounted on or integrally formed as a portion of the interposer 1230, such that the extension 1232 is aligned to contact the extension 1250 formed (e.g. mounted) on the first wafer assembly. In state 1202, the extensions 1232 and 1250 are relatively non-pliant such that the closure of the two wafer assemblies is halted (e.g., as a "hard stop" closure) in response to the contacting of the extensions 1232 and 1250. The closure of the gap "z" limits the compressive forces from being further applied to the bondline structure 1235 (as well as limits the compressive forces against being transferred to the compressible gold-indium-gold layers of the bondline structure 1235).

An example apparatus can include: a first substrate that defines a first boundary of a cavity; a bondline structure positioned along a periphery of the cavity; and a diffusion barrier positioned adjacent to the bondline. Useful examples of apparatus and methods of operation thereof are described herein.

The first substrate can include silicon, and the second substrate can include glass. The substrates are usually wafers, and can be processed (and singulated) to formed sealed enclosures on a die. A microelectromechanical system (MEMS device) can be enclosed in a cavity of the sealed enclosure. The MEMS device can include arrays of mirrors, where each mirror is usually rotatably coupled to the first substrate.

The bondline structure is positioned along the periphery of the cavity and extends from the first surface. The bondline structure is arranged to bond to a second substrate, which includes a second surface defining a second boundary of the cavity. The bondline structure can include: a first gold layer; a second gold layer; and an indium layer formed therebetween. The indium layer can include an intermetallic species deposited between the first gold layer and the second gold layer. The first gold layer can be formed on the first substrate, and the second gold layer can be formed on an interposer formed on the second substrate. The cavity includes a headspace delimited by first and second substrates and a stack that includes the interposer and the diffusion barrier.

The diffusion barrier can be positioned adjacent to and along the bondline structure. The diffusion barrier can be lineally arranged between the bondline structure and the headspace to impede a contaminant against migrating from the bondline structure into the headspace. The bondline structure and the diffusion barrier can be coupled to the first substrate. An interposer is positioned between the first and the second substrate, and is positioned adjacent to the bondline structure and the diffusion barrier. The interposer extends along the periphery of the headspace and can include silicon.

The diffusion barrier can include a first extension formed on the first substrate arranged to contact a second extension formed on an interposer formed on the second substrate. The second extension can include a deformable (e.g., pliant) structure, such that the pliant structure deforms when forced against the first extension. The pliant structure can include an aperture (e.g., to provide room for formation of other chip structures or to simplify manufacturing processes).

A method of forming an apparatus has been introduced. The method includes forming a bondline structure extending from a first surface of a first substrate. The bondline structure is formed at a periphery of a headspace. The method further includes positioning a diffusion barrier adjacent to the bondline structure and arranging the diffusion barrier to impede a contaminant from the bondline structure against entering the headspace.

Modifications are possible in the described examples, and other examples are possible, within the scope of the claims.

What is claimed is:

1. Apparatus, comprising:
   a substrate;
   a bondline structure on the substrate;
   a diffusion barrier on the substrate, the diffusion barrier having an aperture, the aperture configured to compressively deform; and
   an interposer on the bondline structure and on the diffusion barrier.

2. The apparatus of claim 1, wherein the diffusion barrier comprises a first barrier extension on the substrate, and a second barrier extension on the interposer, the first barrier extension coupled to the second barrier extension.

3. The apparatus of claim 1, wherein the aperture is a closed aperture.

4. The apparatus of claim 1, wherein the aperture is an open aperture.

5. The apparatus of claim 1, wherein the diffusion barrier comprises a cantilevered structure.

6. The apparatus of claim 1, wherein the diffusion barrier includes a portion of the substrate adjacent the bondline structure.

7. The apparatus of claim 1, wherein the substrate is a first substrate, the apparatus further comprising a second substrate on the interposer.

8. The apparatus of claim 7, wherein the first substrate comprises silicon, and the second substrate comprises glass.

9. The apparatus of claim 1, wherein the bondline structure comprises a gold layer and an indium layer in contact with the gold layer, the indium layer comprising an intermetallic species.

10. The apparatus of claim 1, further comprising a microelectromechanical system (MEMS) element on the substrate.

11. Apparatus, comprising:
    a first substrate;
    a second substrate;
    an interposer on the second substrate;
    an element on the first substrate;
    a bondline structure between the first substrate and the interposer; and
    a diffusion barrier between the interposer and the first substrate, the diffusion barrier having an aperture, the aperture configured to compressively deform.

12. The apparatus of claim 11, wherein the diffusion barrier comprises a first barrier extension on the first substrate and a second barrier extension on the interposer, the first barrier extension coupled to the second barrier extension, and at least one of the first and the second barrier extensions includes a structure that is pliantly deformable responsive to a coupling of the first and second barrier extensions.

13. The apparatus of claim 12, wherein the aperture is a closed aperture.

14. The apparatus of claim 12, wherein the aperture is an open aperture.

15. The apparatus of claim 12, wherein the diffusion barrier comprises a cantilevered structure.

16. The apparatus of claim 11, wherein the element is a microelectromechanical system (MEMS) device.

17. The apparatus of claim 11, wherein the diffusion barrier extends around the element.

18. Apparatus, comprising:
    a substrate;
    a bondline structure on the substrate;
    a diffusion barrier on the substrate, wherein the diffusion barrier comprises a cantilevered structure; and
    an interposer on the bondline structure and on the diffusion barrier.

19. The apparatus of claim 18, wherein the substrate is a first substrate, the apparatus further comprising a second substrate, wherein the interposer is between the bondline structure and the second substrate and between the diffusion barrier and the second substrate.

20. The apparatus of claim 18, wherein the cantilevered structure comprises a flexible arm over an open aperture, the open aperture having an unsupported side.

* * * * *